(12) United States Patent
Kim et al.

(10) Patent No.: US 12,040,308 B2
(45) Date of Patent: Jul. 16, 2024

(54) METHOD OF MANUFACTURING A SEMICONDUCTOR DEVICE

(71) Applicant: SK hynix Inc., Icheon-si (KR)

(72) Inventors: Jin Woong Kim, Icheon-si (KR); Sung Kyu Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 261 days.

(21) Appl. No.: 17/707,654

(22) Filed: Mar. 29, 2022

(65) Prior Publication Data
US 2023/0130929 A1 Apr. 27, 2023

(30) Foreign Application Priority Data

Oct. 26, 2021 (KR) .................. 10-2021-0144058

(51) Int. Cl.
*H01L 23/00* (2006.01)
*H01L 21/768* (2006.01)

(52) U.S. Cl.
CPC ........ *H01L 24/81* (2013.01); *H01L 21/76841* (2013.01); *H01L 21/76898* (2013.01); *H01L 24/11* (2013.01); *H01L 24/13* (2013.01); *H01L 2224/11011* (2013.01); *H01L 2224/13147* (2013.01); *H01L 2224/81895* (2013.01); *H01L 2224/81896* (2013.01)

(58) Field of Classification Search
CPC ............... H01L 24/81; H01L 21/76841; H01L 21/76898; H01L 24/11; H01L 24/13; H01L 2224/11011; H01L 2224/13147; H01L 2224/81895; H01L 2224/81896; H01L 24/03; H01L 24/05; H01L 24/08; H01L 24/80; H01L 23/481; H01L 21/76832; H01L 21/76834; H01L 23/5226; H01L 25/0657; H01L 2225/06541
See application file for complete search history.

(56) References Cited

U.S. PATENT DOCUMENTS

| 10,163,864 | B1 | 12/2018 | England | |
| 2015/0123278 | A1* | 5/2015 | Park | H01L 24/03 257/774 |
| 2020/0083187 | A1* | 3/2020 | Wu | H01L 21/486 |

\* cited by examiner

*Primary Examiner* — Karen Kusumakar
*Assistant Examiner* — Shawn Shaw Muslim
(74) *Attorney, Agent, or Firm* — William Park & Associates Ltd.

(57) ABSTRACT

A method of manufacturing a semiconductor device includes forming a first through via surrounded by a liner in a first semiconductor substrate, first-recessing the semiconductor substrate to expose a first portion of the liner covering an end portion of the first through via, and forming a first diffusion barrier layer covering the first-recessed first semiconductor substrate and exposing a second portion of the liner. The method also includes removing the second portion of the liner and second-recessing the first diffusion barrier layer. The method further includes forming a second diffusion barrier layer that covers the second-recessed first diffusion barrier layer and a top portion of the liner from which the second portion is removed and exposes a top surface of the end portion of the first through via.

20 Claims, 15 Drawing Sheets

METHOD OF MANUFACTURING A SEMICONDUCTOR DEVICE

CROSS-REFERENCE TO RELATED APPLICATIONS

The present application claims priority under 35 U.S.C. 119(a) to Korean Applications No. 10-2021-0144058, filed on Oct. 26, 2021, which is incorporated herein by reference in its entirety.

BACKGROUND

1. Technical Field

The present disclosure generally relates to a semiconductor technology, and more particularly, to a method of manufacturing a semiconductor device including a through via.

2. Related Art

Semiconductor devices are used as components constituting various electronic applications. The semiconductor devices may be used as components constituting a personal computer, a mobile phone, a camera, and the like. Various processes are applied to manufacture a semiconductor device. The processes of manufacturing a semiconductor device may include processes of depositing conductive, dielectric, or insulating layers on a semiconductor substrate or semiconductor wafer, and patterning these layers to form circuit components. The processes of manufacturing a semiconductor device may include processes of separating a semiconductor substrate on which circuit elements are integrated into individual dies and packaging the individual dies.

As the integration density required for a semiconductor device increases, a three-dimensional (3D) semiconductor device is being developed. The 3D semiconductor device may be configured in a form in which another semiconductor device is stacked on a semiconductor device. A smaller form factor may be required for the 3D semiconductor device. The stacked semiconductor devices may be electrically and signally connected to each other through an interconnection structure including through vias.

SUMMARY

A method of manufacturing a semiconductor device in accordance with the present disclosure includes forming a first through via surrounded by a liner in a first semiconductor substrate, first-recessing the semiconductor substrate to expose a first portion of the liner covering an end portion of the first through via, and forming a first diffusion barrier layer covering the first-recessed first semiconductor substrate and exposing a second portion of the liner. The method also includes removing the second portion of the liner and second-recessing the first diffusion barrier layer. The method further includes forming a second diffusion barrier layer that covers the second-recessed first diffusion barrier layer and a top portion of the liner from which the second portion is removed and exposes a top surface of the end portion of the first through via.

DETAILED DESCRIPTION

Figure 1:
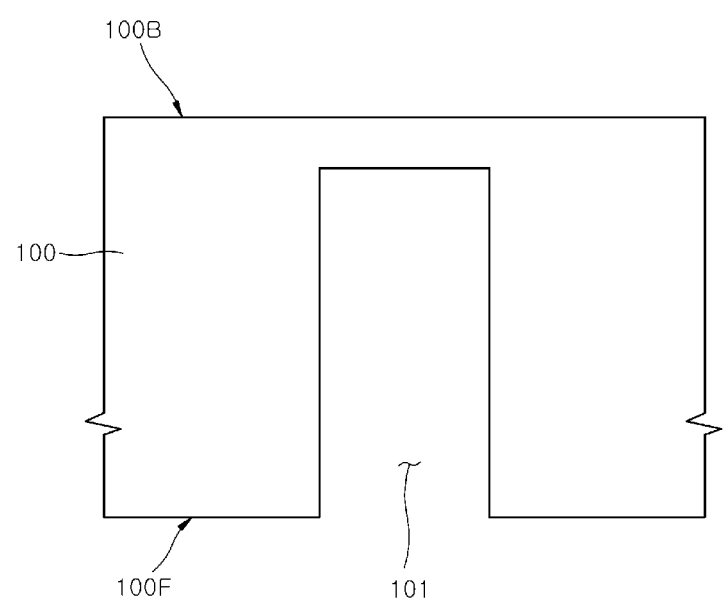
FIGS. 1 to 14 are schematic cross-sectional views illustrating a method of manufacturing a semiconductor device according to an embodiment of the present disclosure.

The terms used herein may correspond to words selected in consideration of their functions in presented embodiments, and the meanings of the terms may be construed to be different according to a person of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first" and "second," "side," "top," and "bottom or lower" may be used herein to describe various devices, these devices should not be limited by these terms. These terms are only used to distinguish one device from another device, but not used to indicate a particular sequence or number of devices.

The semiconductor device may include a semiconductor substrate or a structure in which a plurality of semiconductor substrates are stacked. The semiconductor device may refer to a semiconductor package structure in which a structure in which semiconductor substrates are stacked is packaged. The semiconductor substrate may refer to a semiconductor wafer, a semiconductor die, or a semiconductor chip in which electronic components and devices are integrated. The semiconductor chip may refer to a memory chip in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processors such as application processors (Aps), graphic processing units (GPUs), central processing units (CPUs) or system-on-chips (SoCs). The semiconductor device may be employed in information communication systems such as mobile phones, electronic systems associated with biotechnology or health care, or wearable electronic systems. The semiconductor device may be applicable to internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIGS. 1 to 14 are schematic cross-sectional views illustrating a method of manufacturing a semiconductor device according to an embodiment of the present disclosure.

FIG. 1 is a schematic cross-sectional view illustrating a process step of forming an opening 101 in a first semiconductor substrate 100 of a semiconductor device according to an embodiment of the present disclosure.

Referring to FIG. 1, the first semiconductor substrate 100 may include a semiconductor material such as silicon (Si). The first semiconductor substrate 100 may be a substrate including initial first surface 100B and second surface 100F. The initial first surface 100B and second surface 100F may be opposite surfaces. The initial first surface 100B may be a backside of the first semiconductor substrate 100, and the second surface 100F may be a frontside of the first semiconductor substrate 100. The second surface 100F of the first semiconductor substrate 100 may include an active surface in which integrated circuit elements (not shown) are integrated. The integrated circuit elements may include memory devices such as a DRAM device or a NAND device. The initial first surface 100B of the first semiconductor substrate 100 may be a surface in which integrated circuit elements are not integrated.

The opening 101 may be formed in the second surface 100F of the first semiconductor substrate 100. The opening 101 may be formed in the form of a concave hole extending from the second surface 100F of the first semiconductor substrate 100 toward the initial first surface 100B. The opening 101 of the concave hole might not extend to the initial first surface 100B of the first semiconductor substrate 100, so that a bottom of the opening 101 may be spaced apart from the initial first surface 100B of the first semiconductor substrate 100. The opening 101 may be formed by forming an etch mask (not shown) on the second surface 100F of the first semiconductor substrate 100 and removing the region of the first semiconductor substrate 100 left exposed by the etch mask. The process of forming the opening 101 may precede a process of integrating integrated circuit elements in the second surface 100F of the first semiconductor substrate 100.

Figure 2:
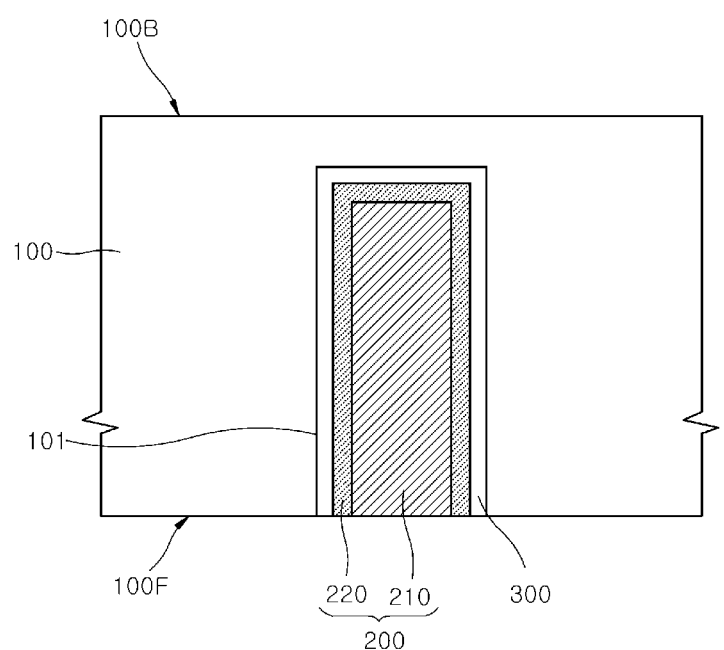

FIG. 2 is a schematic cross-sectional view illustrating a process step of forming a first through via 200 in the opening 101 of the semiconductor device according to an embodiment of the present disclosure.

Referring to FIG. 2, a liner 300 may be formed in the opening 101 formed in the first semiconductor substrate 100. The liner 300 may be formed as a layer extending to conformally cover the side wall and bottom of the opening 101. The liner 300 may be formed to have a concave shape or a nest shape following the shape of the opening 101. A side barrier 220 covering the liner 300 may be formed. The side barrier 220 may be formed as a layer conformally extending along the shape of the liner 300 or the opening 101. The side barrier 220 may be formed to have a concave shape or a nest shape.

A through via body 210 may be formed to cover the side barrier 220 and substantially fill and bury the opening 101. The side barrier 220 may be formed as a layer covering the side and top of the through via body 210. The side barrier 220 may be formed as a layer extending along an interface between the through via body 210 and the liner 300. The liner 300 may be formed as a layer extending along an interface between the first through via 200 and the first semiconductor substrate 100. The liner 300 may be formed as a layer extending along an interface between the side barrier 220 of the first through via 200 and the first semiconductor substrate 100. The first through via 200 may be formed in a shape substantially surrounded by the liner 300.

The first through via 200 may be introduced as a vertical connecting member buried in the first semiconductor substrate 100. The first through via 200 may include a conductive material. The first through via 200 may be introduced as a vertical connecting member such as a through silicon via (TSV). The first through via 200 may include copper (Cu), which is a metal material having a lower electrical resistance than aluminum (Al) or conductive polycrystalline silicon.

The first through via 200 may include the through via body 210 and the side barrier 220. The through via body 210 may be formed in a pillar shape or plug shape substantially including copper (Cu). The side barrier 220 may be introduced as a layer that reduces or substantially prevents diffusion of copper (Cu) ions from the through via body 210 toward the semiconductor substrate 100. The side barrier 220 may prevent diffusion of copper (Cu) ions, so that it is possible to reduce or substantially prevent copper (Cu) or copper ions constituting the through via body 210 from being diffused into the first semiconductor substrate 100 and contaminating the first semiconductor substrate 100. The side barrier 220 may be formed of a diffusion barrier material that prevents diffusion of copper (Cu) ions. The side barrier 220 may include a tantalum (Ta) layer or a tantalum nitride (TaN) layer. The side barrier 220 may include a double layer of a tantalum layer and a tantalum nitride layer. A tantalum layer may be disposed between the through via body 210 and the tantalum nitride layer.

The liner 300 may be formed at the interface between the side barrier 220 and the first semiconductor substrate 100. The liner 300 may be introduced as an insulation layer that electrically isolates the side barrier 220 and the first semiconductor substrate 100. The liner 300 may be introduced as an insulation layer that electrically isolates the first through via 200 and the first semiconductor substrate 100. The liner 300 may be introduced as a buffer layer that relieves or reduces stress that may be involved between the first through via 200 and the first semiconductor substrate 100. The liner 300 may include a silicon dioxide ($SiO_2$) layer that may act as a stress buffer. The silicon dioxide ($SiO_2$) layer may include silicon oxide such as tetraethyl orthosilicate (TEOS).

Figure 3:
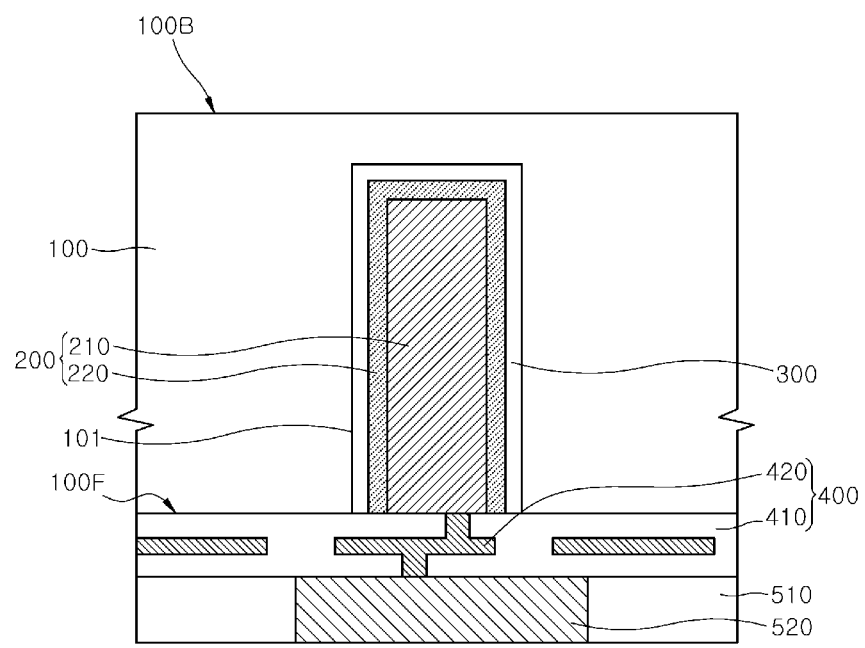

FIG. 3 is a schematic cross-sectional view illustrating a process step of forming an interconnection layer 420 of the semiconductor device according to an embodiment of the present disclosure.

Referring to FIG. 3, a multilevel interconnection layer 400 may further be formed under the second surface 100F of the first semiconductor substrate 100. A second conductive bump 520 and a fourth diffusion barrier layer 510 may be formed under the multilevel interconnection structure layer 400. The description of "second" or "fourth" is a description for distinguishing elements, and should not be construed as a description specifying the order of elements. The multilevel interconnection structure 400 may include an interconnection layer 420 electrically connected to the first through via 200 and an insulation layer 410 insulating the interconnection layer 420. The multilevel interconnection structure 400 may include a plurality of interconnection layers 420. The interconnection layers 420 may include conductive patterns positioned at different levels. The interconnection layers 420 may electrically connect the first through via 200 to the second conductive bump 520.

The second conductive bump 520 may be introduced as a connecting member that electrically connects the first semiconductor substrate 100 or the first through via 200 to external devices or other semiconductor substrates. The fourth diffusion barrier layer 510 may include a passivation layer that covers and protects the multilevel interconnection structure 400. The second conductive bump 520 may be electrically connected to the integrated circuit elements integrated in the first semiconductor substrate 100 through the interconnection layers 420 of the multilevel interconnection structure 400. The second conductive bump 520 may include a metal material substantially the same as a metal material constituting the first through via 200 or the through via body 210. The second conductive bump 520 may substantially include copper (Cu). The fourth diffusion barrier layer 510 may include a diffusion barrier material. The diffusion barrier material may include silicon nitride ($Si_3N_4$) that can substantially prevent copper (Cu) constituting the second conductive bump 520 from being undesirably diffused out of the second conductive bump 520.

Figure 4:
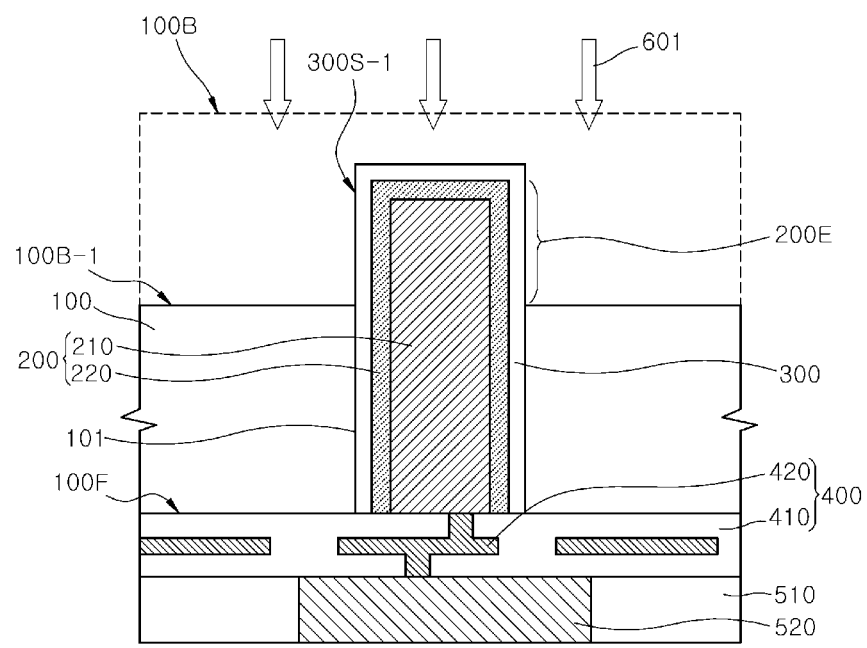

FIG. 4 is a schematic cross-sectional layer illustrating a process step of first-recessing (601) the first semiconductor substrate 100 of the semiconductor device according to an embodiment of the present disclosure.

Referring to FIG. 4, the first semiconductor substrate 100 may be first-recessed (601) from the initial first surface 100B. As a portion of the first semiconductor substrate 100 is selectively removed by the first recessing, the thickness of the first semiconductor substrate 100 may be reduced. As the first semiconductor substrate 100 is first recessed (601), a first-recessed first surface 100B-1 may be formed. The first semiconductor substrate 100 may be first-recessed (601) by a dry etch process. The dry etch process may be performed by selectively removing silicon (Si) that may constitute the first semiconductor substrate 100.

In the first-recessing (601), a portion of the first semiconductor substrate 100 may be removed so that an end portion 200E of the first through via 200 protrudes from the first-recessed first surface 100B-1 of the first semiconductor substrate 100. The end portion 200E of the first through via 200 may be a portion of the first through via 200 that is closer to the first surface 100B or the first-recessed first surface 100B-1 of the first semiconductor substrate 100 than the second surface 100F. The end portion 200E of the first through via 200 may protrude from the first-recessed first surface 100B-1 of the first semiconductor substrate 100 while being covered by the liner 300. In the first-recessing (601), a portion of the first semiconductor substrate 100 may be removed to expose a first portion 300S-1 of the liner 300, which is a portion covering the end portion 200E of the first through via 200. The first portion 300S-1 of the liner 300 may be a portion of the liner 300 that covers a side portion and an upper portion of the end portion 200E of the first through via 200 protruding outside the first-recessed first surface 100B-1 of the first semiconductor substrate 100.

Referring to FIG. 4 along with FIG. 3, before performing the first-recessing (601), process steps of forming the interconnection layer 420, the insulation layer 410, the second conductive bump 520, and the fourth diffusion barrier layer 510 on the second surface 100F opposite to the initial first surface 100B to which the first-recessing (601) of the first semiconductor substrate 100 is performed may be performed in advance.

Figure 5:
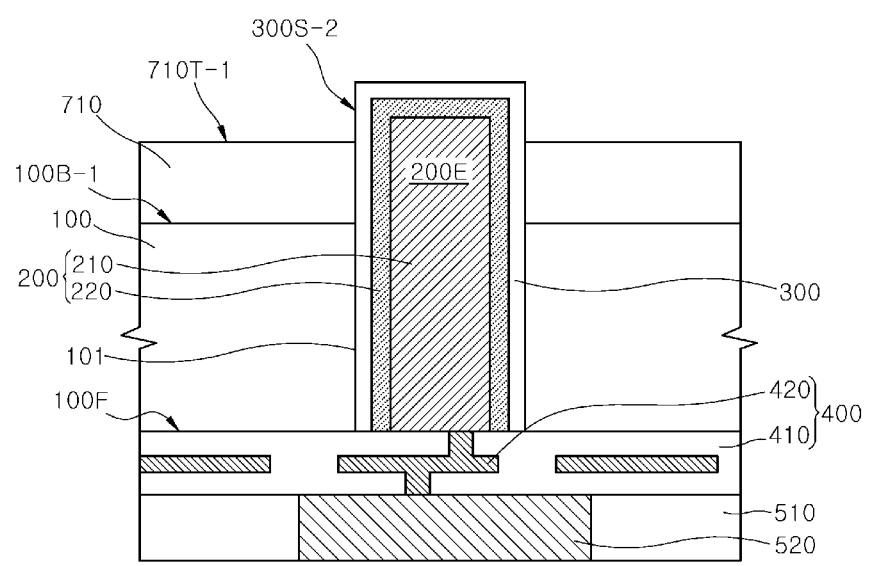

FIG. 5 is a schematic cross-sectional view illustrating a process step of forming a first diffusion barrier layer 710 of the semiconductor device according to an embodiment of the present disclosure.

Referring to FIG. 5, the first diffusion barrier layer 710 may be formed to cover the first recessed first semiconductor substrate 100 and expose a second portion 300S-2 of the liner 300. The first diffusion barrier layer 710 may be formed so that the first portion (300S-1 of FIG. 4) of the liner 300 is partially covered and a portion of the end portion 200E of the first through via 200 protrudes from a surface 710T-1 of the first diffusion barrier layer 710 while being covered by the second portion 300S-2 of the liner. The second portion 300S-2 of the liner 300 exposed by the first diffusion barrier layer 710 may be a portion of the first portion 300S-1 of the liner 300. The first diffusion barrier layer 710 may include a diffusion barrier material capable of substantially preventing diffusion of copper (Cu) or copper (Cu) ions constituting the first through via 200, the through via body 210, or the second conductive bump 520. The first diffusion barrier layer 710 may include a dielectric material capable of more firmly preventing diffusion of copper (Cu) ions than silicon oxide constituting the liner 300. The first diffusion barrier layer 710 may include a silicon nitride layer.

Figure 6:
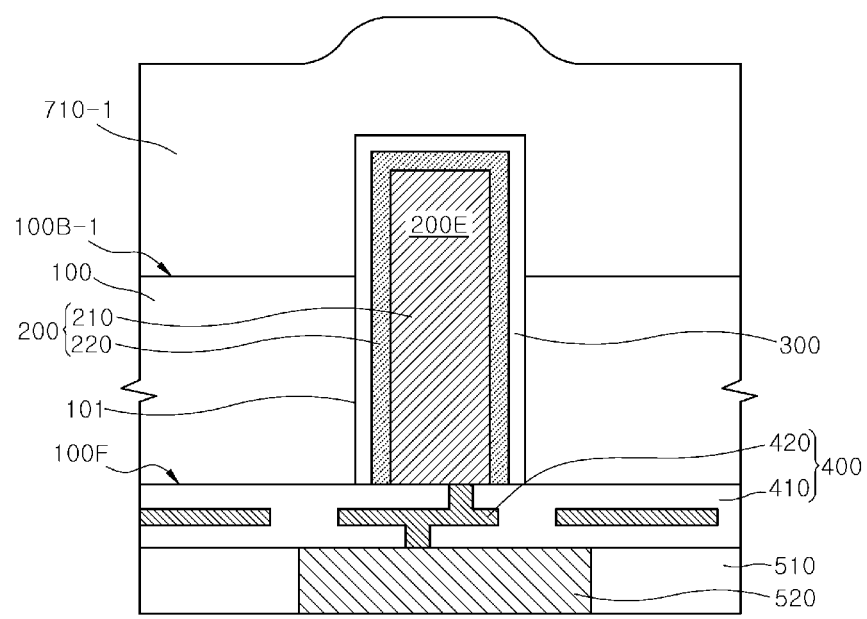
Figure 7:
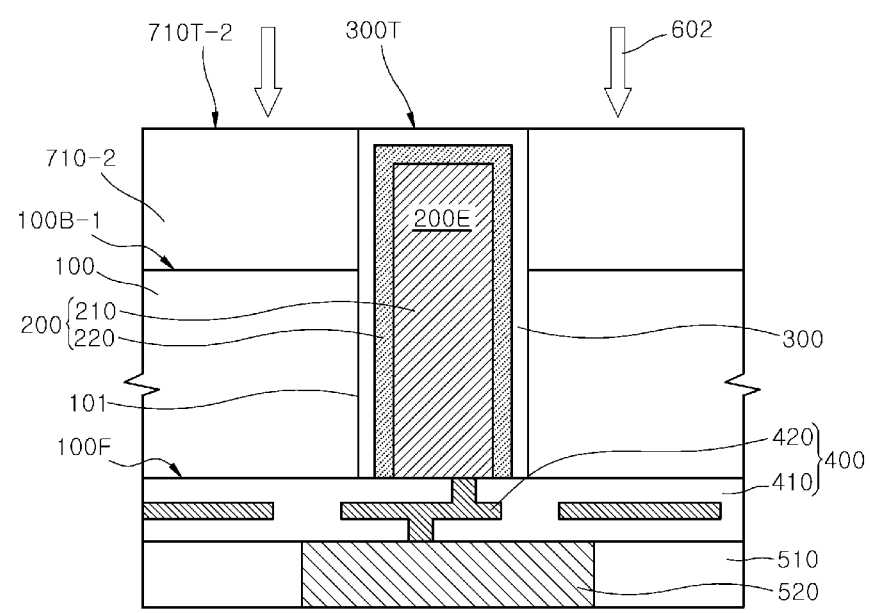
Figure 8:
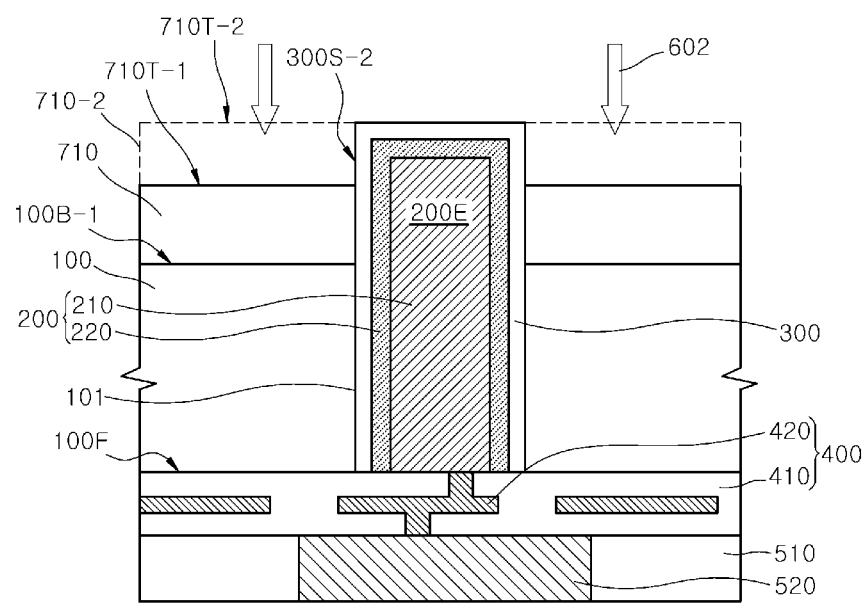

FIGS. 6 to 8 are schematic cross-sectional views illustrating a detailed process step of forming the first diffusion barrier layer 710 of FIG. 5.

Referring to FIG. 6, an initial first diffusion barrier layer 710-1 extending to cover the end portion 200E of the first through via 200 may be formed on the first-recessed first surface 100B-1 of the first semiconductor substrate 100. The initial first diffusion barrier layer 710-1 covering the first portion (300S-1 of FIG. 4) of the liner may be formed by depositing silicon nitride on the first-recessed first surface 100B-1 of the first semiconductor substrate 100.

Referring to FIGS. 6 and 7, the initial first diffusion barrier layer 710-1 may be planarized. A chemical mechanical polishing (CMP) process may be performed to the initial first diffusion barrier layer 710-1 to form a planarized first diffusion barrier layer 710-1. The chemical mechanical polishing (CMP) process may be performed to the initial first diffusion barrier layer 710-2 to expose a portion of the liner 300 covering the end portion 200E of the first through via 200. The chemical mechanical polishing (CMP) process may be performed to stop polishing at the liner 300. When the portion of the liner 300 is exposed as a planarized surface 710T-2 of the first diffusion barrier layer 710-2, the planarization process may be performed to stop the chemical mechanical polishing (CMP) process.

Referring to FIGS. 8 and 5, the planarized first diffusion barrier layer 710-2 may be third-recessed (602). The description of the third-recessing (602) and the first-recessing (601 in FIG. 4) is for distinguishing elements and is not interpreted as a description for specifying a process sequence. The first diffusion barrier layer 710 exposing the second portion 300S-2 of the liner 300 may be formed by third-recessing (602) the planarized first diffusion barrier layer 710-2.

Figure 9:
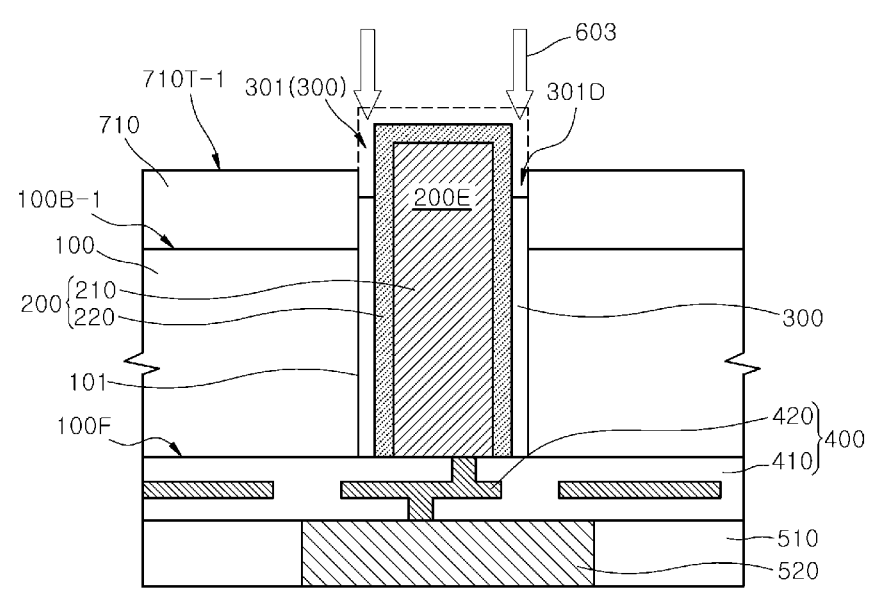

FIG. 9 is a schematic cross-sectional view illustrating a process step of removing (603) a portion 301 of the liner 300 of the semiconductor device according to an embodiment of the present disclosure. That the portion 301 is a portion of the liner 300 is indicted in FIG. 9 with a parenthetical as "301(300)."

Referring to FIG. 9, the process step of removing (603) the portion 301 of the liner 300 surrounding the end portion 200E of the first through via 200 may be performed. As the portion 301 of the liner 300 surrounding the end portion 200E of the first through via 200 is removed, the liner 300 may be limited to a portion between the first semiconductor substrate 100 and the first through via 200 and a portion between the first diffusion barrier layer 710 and the first through via 200. Accordingly, a portion of the side and a portion of the top of the end portion 200E of the first through via 200 may be exposed outside the remaining liner 300. The side barrier 220 may maintain an extended state to cover and surround the through via body 210 of the first through via 200.

The selectively removed portion 301 of the liner 300 may include the second portion (300S-2 of FIG. 5) of the liner 300. As illustrated in FIG. 5, because the second portion 300S-2 of the liner 300 may protrude from the surface 710T-1 of the first diffusion barrier layer 710 and is exposed, the second portion 300S-2 of the liner 300 may be exposed to an etchant used in the removal (603) process step to be etched and removed. The process step of removing (603) the portion 301 of the liner 300 or the second portion 300S-2 of the liner 300 may include a wet etch process. The wet etching process may be performed as a process of selectively removing silicon oxide constituting the liner 300.

As the portion 301 of the liner 300 surrounding the end portion 200E of the first through via 200 is removed by wet etching, concave dents 301D may be introduced or created between the first diffusion barrier layer 710 and the side of the end portion 200E of the first through via 200. The dents 301D may be formed in a concave trench shape in the surface 710T-1 of the first diffusion barrier layer 710. In the process of completely removing the portion 301 of the liner 300 surrounding the end portion 200E of the first through via 200 by wet etching, the liner 300 may be over-etched. Accordingly, the concave dents 301D may be generated.

In a process of depositing another material layer or another diffusion barrier layer on the first diffusion barrier layer 710, the material might not fill the concave dents 301D, so that voids may be generated. Such voids may act as a detrimental factor to the semiconductor device. Diffusion of copper (Cu) may occur through the voids, so that the voids may act as a cause of contamination of the first semiconductor substrate 100.

Figure 10:
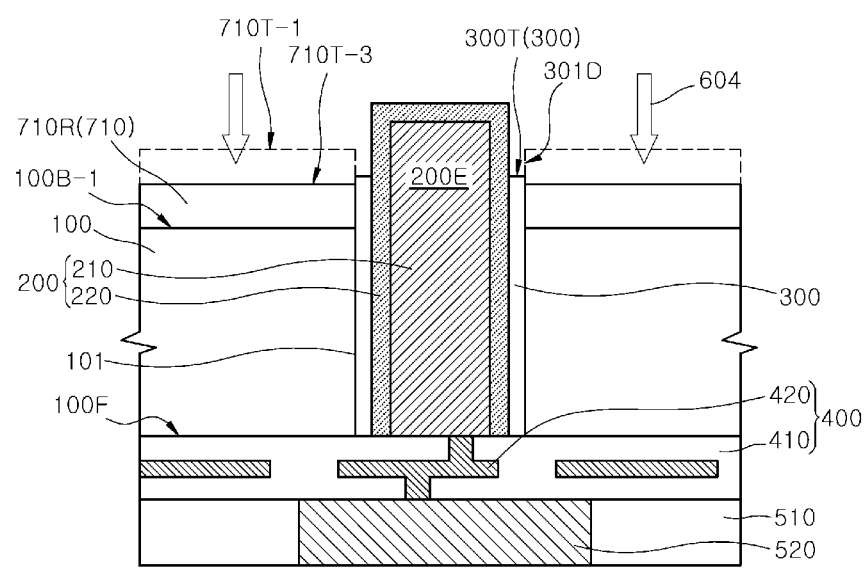

FIG. 10 is a schematic cross-sectional view illustrating a process step of second-recessing (604) the first diffusion barrier layer 710 of the semiconductor device according to an embodiment of the present disclosure.

Referring to FIG. 10, the first diffusion barrier layer 710 may be second-recessed (604). The first diffusion barrier layer 710 may be second-recessed (604) to have a second-recessed surface 710T-3 of a lower height than the surface 710T-1 before the second recessing (604). In the second recessing (604), a portion of the first diffusion barrier layer 710 may be etched and removed so that the dents (310D of FIG. 9) are removed. The first diffusion barrier layer 710 may be second-recessed (604) so that a top portion 300T of the liner 300 remains while the portion (301 of FIG. 9) of the liner 300 or the second portion (300S-2 of FIG. 5) of the liner 300 is removed. That the top portion 300T is a top portion of the liner 300 is indicated in FIGS. 10 and 12 with a parenthetical as "300T(300)." Therefore, the top portion 300T of the liner 300 protrudes from the second-recessed surface 710T-3 of the first diffusion barrier layer 710R. As described above, by second-recessing (604) the first diffusion barrier layer 710, the dents 301D may be removed. That the first diffusion barrier layer 710R is what remains of the first diffusion barrier layer 710 after the second recessing 604 is indicated in FIGS. 10, 11, and 12 with a parenthetical as "710R(710)."

Figure 11:
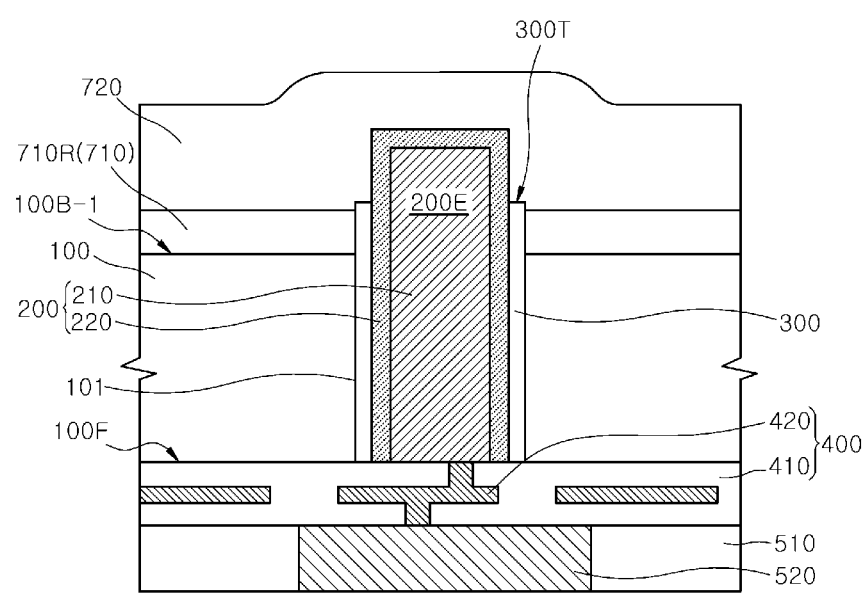
Figure 12:
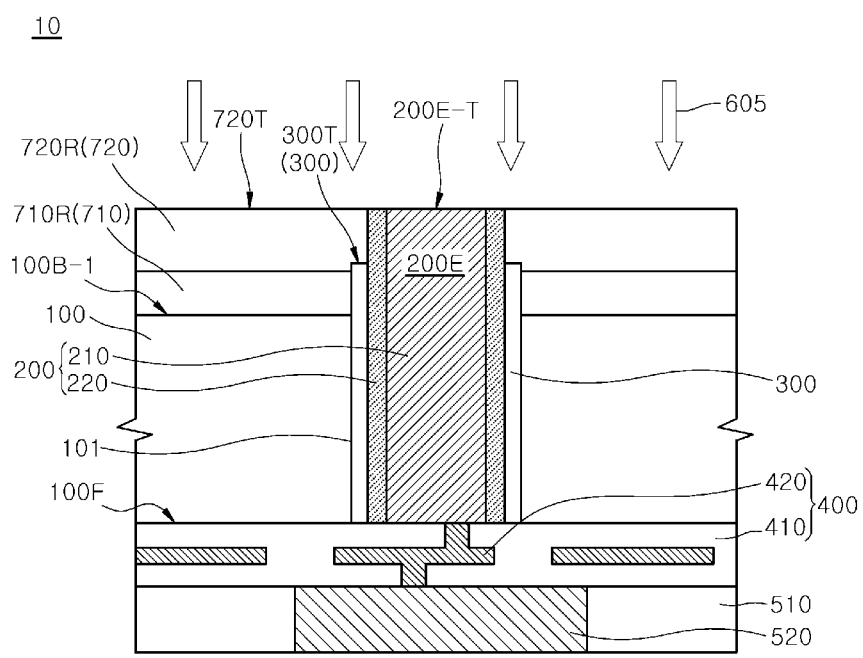

FIGS. 11 and 12 are schematic cross-sectional views illustrating a process step of forming a second diffusion barrier layer 720R of the semiconductor device according to an embodiment of the present disclosure. FIG. 11 illustrates a step of forming an initial second diffusion barrier layer 720 of the semiconductor device, and FIG. 12 illustrates a step of planarizing the initial second diffusion barrier layer 720 of FIG. 11.

Referring to FIG. 11, the initial second diffusion barrier layer 720 may be formed on the first diffusion barrier layer 710R to cover a top portion 300T of the liner 300 and cover the end portion 200E of the first through via 200. As the portion (301 of FIG. 9) or the second portion (300S-2 of FIG. 5) of the liner 300 is removed, the remaining top portion 300T of the liner 300 may be exposed over the first diffusion barrier layer 710R, and the end portion 200E of the first through via 200 may be partially exposed. The initial second diffusion barrier layer 720 may extend to cover the exposed top portion 300T of the liner 300 and the exposed portion of the end portion 200E of the first through via 200.

Figure 13:
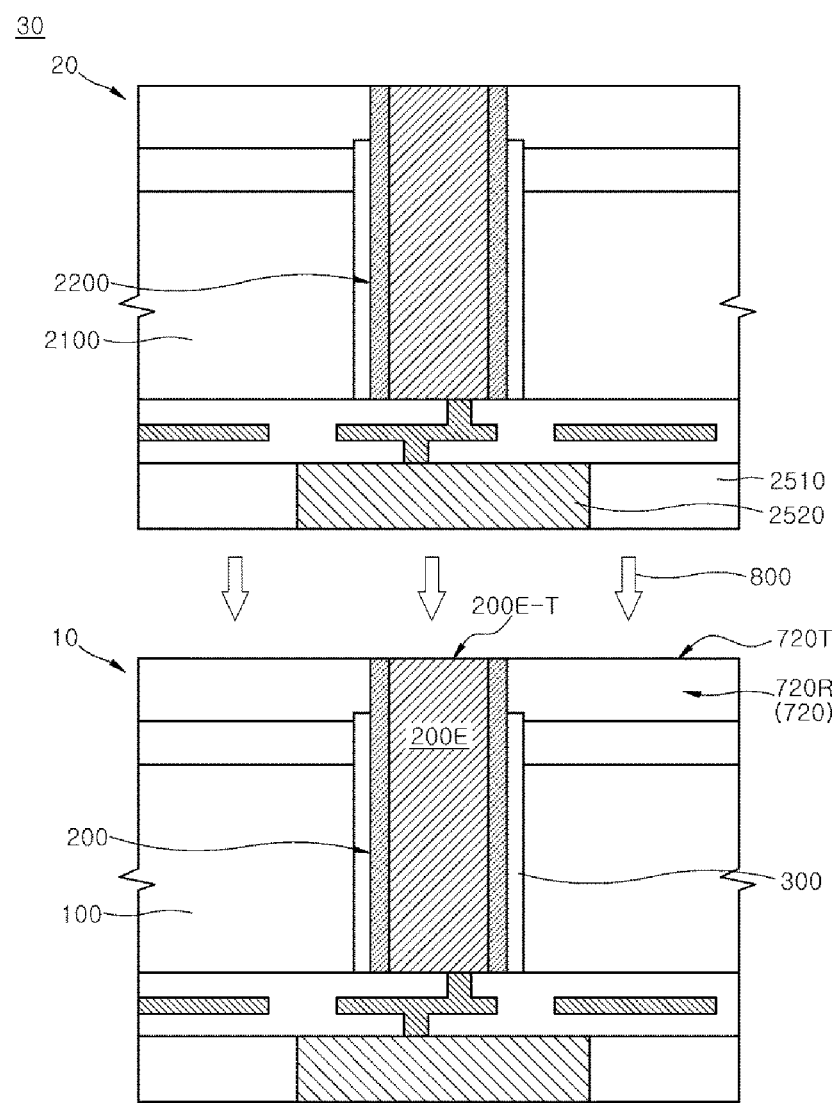

Referring to FIG. 12, the initial second diffusion barrier layer 720 may be planarized (605) to form a planarized second diffusion barrier layer 720R. That the planarized second diffusion barrier layer 720R is what remains of the initial second diffusion barrier layer 720 after planarization 605 is indicated in FIGS. 12 and 13 with a parenthetical as "720R(720)." The planarization (605) may be performed so that the top surface 200E-T of the end portion of the first through via 200 is exposed to a planarized surface 720T of the planarized second diffusion barrier layer 720R. The planarization (605) may be performed to remove a portion of the side barrier 200 so that a top surface of the through via body 210 is exposed to the top surface 200E-T of the end portion 200E of the first through via 200.

The second diffusion barrier layer 720R may be formed to cover and seal the top portion 300T of the liner 300. The second diffusion barrier layer 720R may extend to block a space between the top portion 300T of the liner 300 and the top surface 200E-T of the end portion 200E of the first through via 200. The top portion 300T of the liner 300 and the top surface 200E-T of the end portion 200E of the first through via 200 are blocked by the second diffusion barrier layer 720R, so that the second diffusion barrier layer 720R may substantially prevent diffusion of copper (Cu) ions from the top surface 200E-T of the end portion 200E of the first through via 200 or the top surface of the through via body 210 into the liner 300. Accordingly, it is possible to substantially prevent the first semiconductor substrate 100 from being contaminated with copper (Cu) ions.

The second diffusion barrier layer 720R may include substantially the same diffusion barrier material as the first diffusion barrier layer 710R or a dielectric material. The second diffusion barrier layer 720R may include a dielectric material different from the dielectric material constituting the liner 300. The liner 300 may include silicon oxide, but the second diffusion barrier layer 720R may include silicon nitride.

The first semiconductor device 10 may be implemented by the process steps described above with reference to FIGS. 1 to 12. The first semiconductor device 10 may include the first through via 200 substantially penetrating the first semiconductor substrate 100 and the second diffusion barrier layer 720R exposing the top surface 200E-T of the end portion 200E of the first through via 200. The first semiconductor device 10 may further include the first diffusion barrier layer 710R together with the second diffusion barrier layer 720R. The composite layer structure of the first and second diffusion barrier layers 710R and 720R may substantially prevent copper (Cu) diffusion or copper (Cu) ion diffusion into the liner 300, thereby preventing contamination of the first semiconductor substrate 100. As such, the composite layer structure of the first and second diffusion barrier layers 710R and 720R may prevent diffusion of copper (Cu) ions, so that it is possible to form the first through via 200 on the first semiconductor substrate 100 to have a structure in which the top surface 200E-T of the end portion 200E of the first through via 200 is exposed to the surface 720T of the second diffusion barrier layer 720R. The composite layer structure of the first and second diffusion barrier layers 710R and 720R may prevent diffusion of copper (Cu) ions, so that the introduction of a separate structure, for example, an additional conductive pad on the top surface 200E-T of the end portion 200E of the first through via 200 may be omitted.

Figure 14:
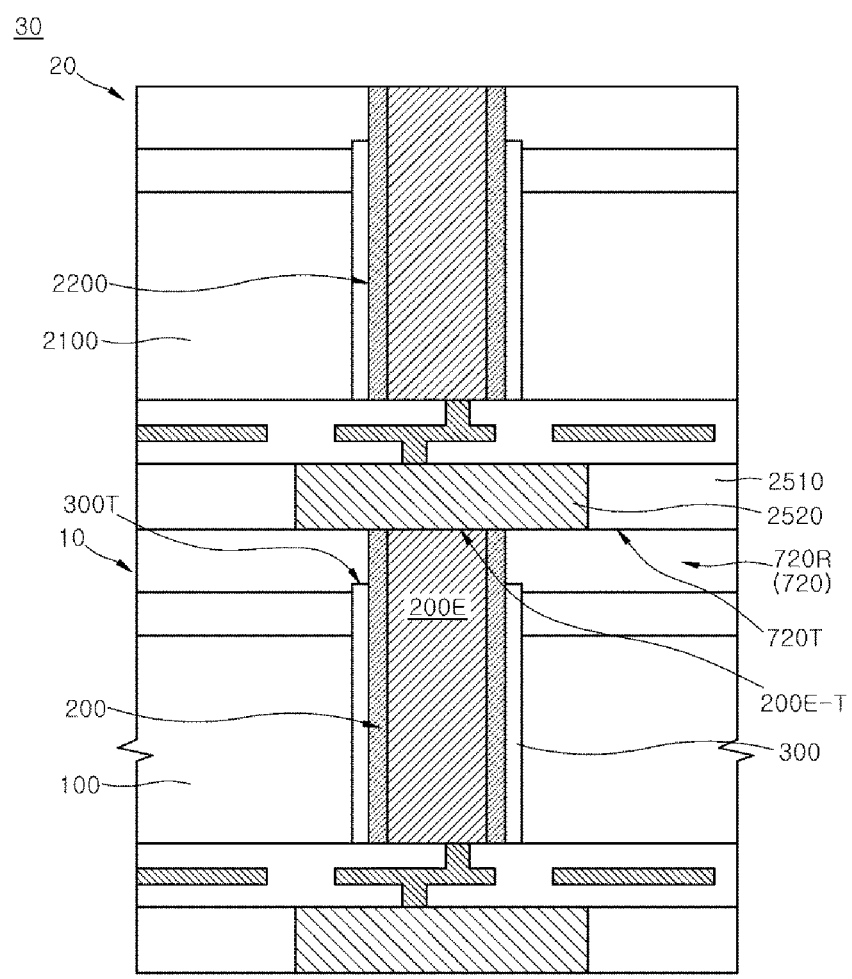

FIGS. 13 and 14 are schematic cross-sectional views illustrating process steps of directly bonding a second semiconductor device 20 to the first semiconductor device 10 to form a semiconductor device 30 according to an embodiment of the present disclosure.

Referring to FIG. 13, the second semiconductor device 20 may be directly bonded to the first semiconductor device 10 to implement the semiconductor device 30 in which the second semiconductor device 20 is stacked on the first semiconductor device 10. The second semiconductor device 20 may be configured in substantially the same form as the first semiconductor device 10. The second semiconductor device 20 may include a second semiconductor substrate 2100, a second through via 2200, a first conductive bump 2520, and a third diffusion barrier layer 2510. The second semiconductor substrate 2100 of the second semiconductor device 20 may have a configuration substantially the same as that of the first semiconductor substrate 100 of the first semiconductor device 10.

The second through via 2200 of the second semiconductor device 20 may have substantially the same configuration as the first through via 200 of the first semiconductor device 10. The second semiconductor device 20 may further include the second through via 2200, and the second through via 2200 may substantially penetrate the second semiconductor substrate 2100. The second through via 2200 may be electrically connected to the first conductive bump 2520.

The first conductive bump 2520 and the third diffusion barrier layer 2510 of the second semiconductor device 20 may have substantially the same configurations as the second conductive bump (520 of FIG. 12) and the fourth diffusion barrier layer (510 of FIG. 12) of the first semiconductor device 10. The first conductive bump 2520 may include substantially the same metal material as the second conductive bump (520 of FIG. 12). The metal material may include copper (Cu). The third diffusion barrier layer 2510 may be formed of substantially the same dielectric material as the fourth diffusion barrier layer (510 of FIG. 12) and may also be formed of substantially the same dielectric material as the second diffusion barrier layer 720R.

The first semiconductor device 10 may be formed by the process steps described with reference to FIGS. 1 to 12, and the second semiconductor device 20 may also be formed by the process steps described with reference to FIGS. 1 to 12. While forming the first conductive bump 2520 and the third diffusion barrier layer 2510 in the second semiconductor substrate 2100 and directly bonding the first conductive bump 2520 to the top surface 200E-T of the end portion 200E of the first through via 200 of the first semiconductor device 10, a process of directly bonding (800) the third diffusion barrier layer 2510 to the surface 720T of the second diffusion barrier layer 720R of the first semiconductor device 10 may be performed. Accordingly, as illustrated in FIG. 14, the semiconductor device 30 in which the second semiconductor device 20 is directly bonded to the first semiconductor device 10 may be formed.

Referring to FIG. 14, each of the first semiconductor device 10 and the second semiconductor device 20 may have a form of a wafer, so that the semiconductor device 30 may have a form in which the wafers are stacked at a wafer level. Alternatively, each of the first semiconductor device 10 and the second semiconductor device 20 may have a form of an individual semiconductor die separated from a semiconductor wafer, so that the semiconductor device 30 may have a form in which semiconductor dies are stacked.

The second semiconductor device 20 may be directly bonded to the first semiconductor device 10. The second semiconductor device 20 and the first semiconductor device 10 may be coupled without introducing another bonding member or a separate connecting member therebetween. The connecting member such as a solder ball or a solder bump might not be interposed between the second semiconductor device 20 and the first semiconductor device 10. A separate organic adhesive layer might not be interposed between the second semiconductor device 20 and the first semiconductor device 10. The second semiconductor device 20 and the first semiconductor device 10 may be bonded to each other while facing surfaces are in contact or in close proximity to each other. A separate adhesive material or an underfill material might not be introduced into the bonded interface where the second semiconductor device 20 is directly bonded to the first semiconductor device 10. Direct bonding of the first and second semiconductor devices 10 and 20 as described above may indicate hybrid bonding of the semiconductor devices 10 and 20.

In the semiconductor device 30, a portion of the surface 720T of the second diffusion barrier layer 720R of the first semiconductor device 10 may be in contact with the first conductive bump 2520 of the second semiconductor device 20. When a width of the first conductive bump 2520 is wider than a width of the first through via 200 or the first conductive bump 2520 is partially misaligned with the first through via 200, a portion of the first conductive bump 2520 may overlap with and contact a portion of the surface 720T of the second diffusion barrier layer 720R. The second diffusion barrier layer 720R is formed of a diffusion barrier material that prevents diffusion of copper (Cu) or copper ions, so that diffusion of copper (Cu) or copper (Cu) ions into the second diffusion barrier layer 720R is substantially difficult even if the portion of the first conductive bump 2520 contacts the surface 720T of the second diffusion barrier layer 720R. Because the second diffusion barrier layer 720R substantially blocks diffusion of copper (Cu) or copper ions from the first conductive bump 2520, diffusion of copper (Cu) or copper (Cu) ions from the first conductive bump 2520 into the first semiconductor device 10 may be substantially blocked. Because the second diffusion barrier layer 720R covers the top portion 300T of the liner 300 from which the second portion (300S-2 in FIG. 5) of the liner has been removed and blocks the top portion 300T of the liner 300 from the first conductive bump 2520, diffusion of copper (Cu) ions from the first conductive bump 2520 to the liner 300 may be substantially blocked by the second diffusion barrier layer 720R.

Figure 15:
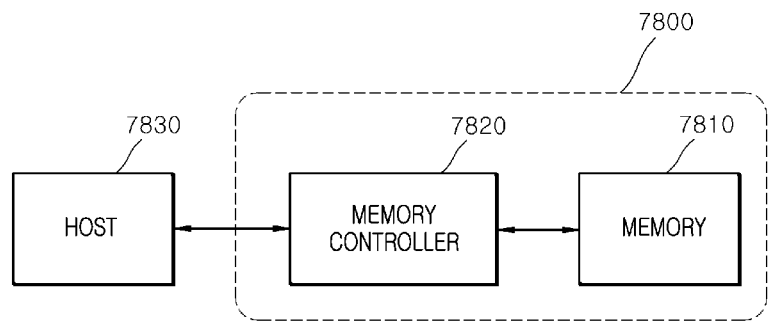
FIG. 15 is a block diagram illustrating an electronic system employing a memory card including a semiconductor package according to an embodiment of the present disclosure.

FIG. 15 is a block diagram illustrating an electronic system including a memory card 7800 employing at least one semiconductor package according to an embodiment of the present disclosure. The memory card 7800 includes a memory device 7810, such as a nonvolatile memory device, and a memory controller 7820. The memory device 7810 and the memory controller 7820 may store data or read out the stored data. At least one of the memory device 7810 and the memory controller 7820 may include at least one semiconductor package according to an embodiment of the present disclosure.

The memory device 7810 may be a nonvolatile memory device to which the technology of the embodiments of the present disclosure is applied. The memory controller 7820 may control the memory device 7810 such that stored data is read out or data is stored in response to a read/write request from a host 7830.

Figure 16:
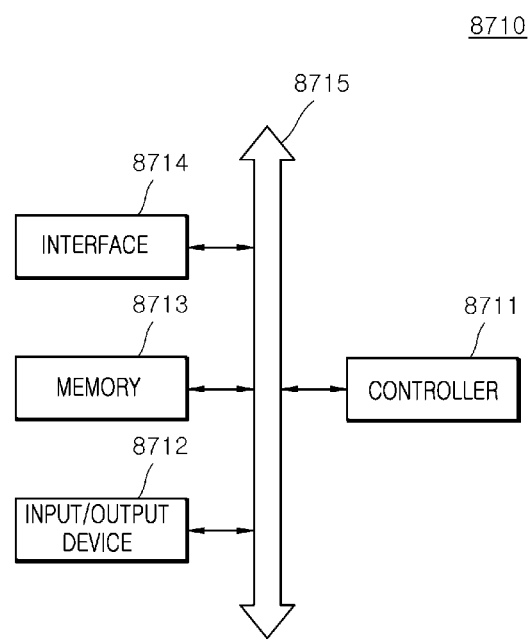
FIG. 16 is a block diagram illustrating an electronic system including a semiconductor package according to an embodiment of the present disclosure.

FIG. 16 is a block diagram illustrating an electronic system 8710 including at least one semiconductor package according to an embodiment of the present disclosure. The electronic system 8710 may include a controller 8711, an input/output device 8712, and a memory device 8713. The controller 8711, the input/output device 8712, and the memory device 8713 may be coupled with one another through a bus 8715 providing a path through which data moves.

In an embodiment, the controller 8711 may include one or more of a microprocessor, digital signal processor, microcontroller, and/or logic device capable of performing the same functions as these components. The controller 8711 or the memory device 8713 may include at least one semiconductor package according to an embodiment of the present disclosure. The input/output device 8712 may include at least one selected among a keypad, a keyboard, a display device, a touchscreen, and so forth. The memory device 8713 is a device for storing data. The memory device 8713 may store data and/or commands to be executed by the controller 8711, and the like.

The memory device 8713 may be a volatile memory device such as a DRAM device or a nonvolatile memory device such as a flash memory device. For example, flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The present teachings have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from an illustrative rather than a restrictive standpoint. The scope of the present teachings are not limited to the above descriptions but instead are defined by the accompanying claims, and all of distinctive features in the equivalent scope should be construed as being included in the present teachings.

What is claimed is:

1. A method of manufacturing a semiconductor device, the method comprising:
    forming a first through via surrounded by a liner in a first semiconductor substrate;
    first-recessing the first semiconductor substrate to expose a first portion of the liner covering an end portion of the first through via;
    forming a first diffusion barrier layer covering the first-recessed first semiconductor substrate and exposing a second portion of the liner;
    removing the second portion of the liner;
    second-recessing the first diffusion barrier layer; and
    forming a second diffusion barrier layer that covers the second-recessed first diffusion barrier layer and a top portion of the liner from which the second portion is removed and exposes a top surface of the end portion of the first through via.

2. The method of claim 1, further comprising:
    forming a first conductive bump and a third diffusion barrier layer on a second semiconductor substrate; and
    directly bonding the third diffusion barrier layer to the second diffusion barrier layer and directly bonding the first conductive bump to the top surface of the end portion of the first through via.

3. The method of claim 2, wherein the second diffusion barrier layer blocks diffusion of copper (Cu) ions from the first conductive bump into the top portion of the liner from which the second portion is removed.

4. The method of claim 2, wherein the first conductive bump includes substantially the same metal material as the first through via.

5. The method of claim 4, wherein the metal material includes copper (Cu).

6. The method of claim 2, wherein the third diffusion barrier layer includes substantially the same dielectric material as the second diffusion barrier layer.

7. The method of claim 2, further comprising forming a second through via that substantially penetrates the second semiconductor substrate and is electrically connected to the first conductive bump.

8. The method of claim 1, wherein first-recessing the first semiconductor substrate is performed so that the end portion of the first through via protrudes from a first-recessed surface of the first semiconductor substrate with the end portion covered by the first portion of the liner.

9. The method of claim 8, wherein forming the first diffusion barrier layer comprises:
    forming an initial first diffusion barrier layer extending to cover the end portion of the first through via on the first-recessed surface of the first semiconductor substrate;
    planarizing the initial first diffusion barrier layer; and
    third-recessing the planarized initial first diffusion barrier layer.

10. The method of claim 1, wherein forming the first diffusion barrier layer comprises forming the first diffusion barrier layer to partially cover the first portion of the liner and protrude from a surface of the first diffusion barrier layer with a portion of the end portion of the first through via covered by the second portion of the liner.

11. The method of claim 1, wherein removing the second portion of the liner comprises creating a concave dent between the end portion of the first through via and the first diffusion barrier layer.

12. The method of claim 11, wherein second-recessing the first diffusion barrier layer comprises etching and removing a portion of the first diffusion barrier layer to remove the dent.

13. The method of claim 1, wherein second-recessing the first diffusion barrier layer is performed so that the top portion of the liner from which the second portion has been removed protrudes from a second-recessed surface of the first diffusion barrier layer.

14. The method of claim 1, wherein forming the second diffusion barrier layer comprises:
   forming an initial second diffusion barrier layer extending to cover the end portion of the first through via from which the second portion of the liner has been removed; and
   planarizing the initial second diffusion barrier layer to expose a top surface of the end portion of the first through via.

15. The method of claim 14, wherein the first through via comprises:
   a through via body including copper (Cu); and
   a side barrier covering the through via body, and
   wherein planarizing the initial second diffusion barrier layer is performed to remove a portion of the side barrier to expose a top surface of the through via body.

16. The method of claim 15, wherein the side barrier includes a tantalum (Ta) layer or a tantalum nitride (TaN) layer.

17. The method of claim 1, wherein the second diffusion barrier layer includes silicon nitride ($Si_3N_4$).

18. The method of claim 1, wherein the second diffusion barrier layer includes substantially the same dielectric material as the first diffusion barrier layer.

19. The method of claim 1, further comprising, before first-recessing the first semiconductor substrate:
   forming an interconnection layer electrically connected to the first through via on another surface of the first semiconductor substrate opposite to the surface on which the first-recessing is performed; and
   forming a second conductive bump electrically connected to the interconnection layer.

20. The method of claim 1, wherein the liner includes a different dielectric material from the second diffusion barrier layer, and
   wherein the different dielectric material includes silicon dioxide ($SiO_2$).

* * * * *